(12) United States Patent
Miyahara

(10) Patent No.: US 7,277,128 B2
(45) Date of Patent: Oct. 2, 2007

(54) IMAGE-SENSING DEVICE HAVING A PLURALITY OF OUTPUT CHANNELS

(75) Inventor: Hiroyuki Miyahara, Yokohama (JP)

(73) Assignee: Victor Company of Japan, Ltd., Yokohama (JP)

( * ) Notice: Subject to any disclaimer, the term of this patent is extended or adjusted under 35 U.S.C. 154(b) by 766 days.

(21) Appl. No.: 10/408,245

(22) Filed: Apr. 8, 2003

(65) Prior Publication Data

US 2003/0193591 A1 Oct. 16, 2003

(30) Foreign Application Priority Data

Apr. 10, 2002 (JP) ............... 2002-107569

(51) Int. Cl.
| | |
|---|---|
| H04N 5/217 | (2006.01) |
| H04N 6/64 | (2006.01) |
| H04N 5/335 | (2006.01) |
| H04N 3/14 | (2006.01) |

(52) U.S. Cl. .............. 348/249; 348/241; 348/248; 348/250; 348/316; 348/313; 348/323

(58) Field of Classification Search ............... 348/243, 348/245, 315, 187, 249, 248, 250; 358/213; 257/232; 377/58; 357/24
See application file for complete search history.

(56) References Cited

U.S. PATENT DOCUMENTS

| | | | | |
|---|---|---|---|---|
| 4,523,326 A | * | 6/1985 | Hewitt et al. ............... 377/58 |
| 4,647,977 A | | 3/1987 | Tower | |
| 4,811,068 A | * | 3/1989 | Kinoshita ................... 257/232 |
| 5,467,128 A | * | 11/1995 | Yates et al. ................. 348/187 |

FOREIGN PATENT DOCUMENTS

| | | |
|---|---|---|
| EP | 0866502 | 9/1998 |
| JP | 59-011674 | 1/1984 |
| JP | 02-078382 | 3/1990 |
| JP | 8181921 | 7/1996 |
| JP | 10-505724 | 6/1998 |
| JP | 10-336529 | 12/1998 |
| JP | 11-027589 | 1/1999 |
| JP | 2000-106655 | 4/2000 |
| JP | 2000138869 A * | 5/2000 |
| JP | 2001-094886 | 4/2001 |

* cited by examiner

*Primary Examiner*—David Ometz
*Assistant Examiner*—Wanda M. Negrón
(74) *Attorney, Agent, or Firm*—Connolly Bove Lodge & Hutz LLP

(57) ABSTRACT

An image-sensing device has pixel areas for outputting CCD signals of plural channels, and an adjusting portion for adjusting a level of each channel of the CCD signals outputted from the pixel area. A first channel CCD signal is provided from a pixel area $11a$, a horizontal OB area $15a$, a slide shift area $12a$, and an HCCD $13a$. A second channel CCD signal is provided from a pixel area $11b$, a horizontal OB area $15b$, a slide shift area $12b$, and an HCCD $13b$. Both of the first and second CCD signals are supplied to the adjusting portion with a reference signal added. The adjusting portion controls CCD signal of each channel by making the level of reference signal the same. The variation of the shift efficiency of electric charge in the border of pixel areas $11a$ and $11b$ for each channel, and in the slide shift areas $13a$ and $13b$ can be compensated.

8 Claims, 3 Drawing Sheets

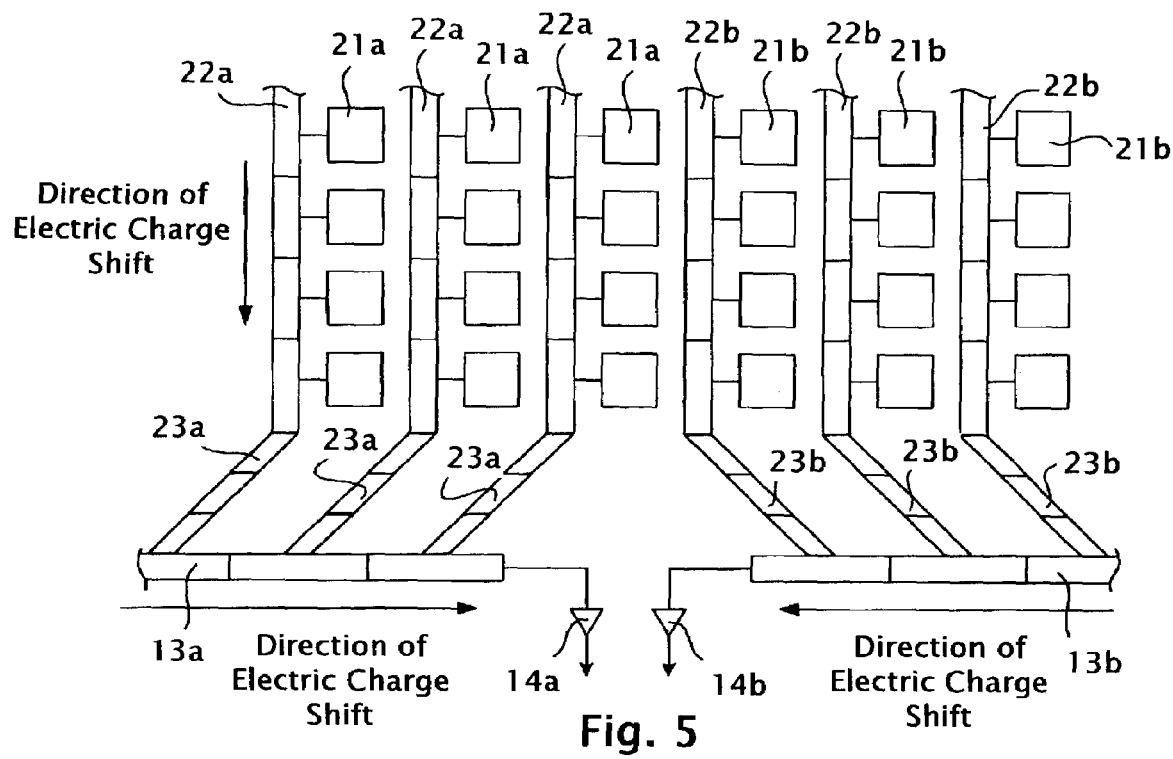
Fig. 5
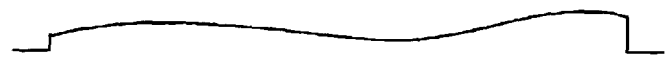
Fig. 6 (a)
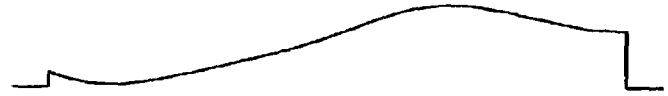
Fig. 6 (b)
Fig. 6 (c)
Fig. 6 (d)
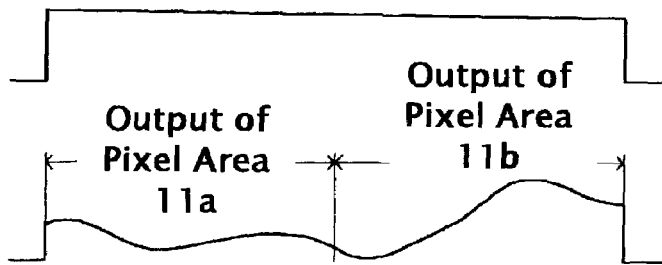
Output of Pixel Area 11a — Output of Pixel Area 11b
Fig. 6 (e)

IMAGE-SENSING DEVICE HAVING A PLURALITY OF OUTPUT CHANNELS

BACKGROUND OF THE INVENTION

1. Field of the Invention

The present invention relates to an image-sensing device having a plurality of output channels for use in a video camera which can obtain a moving picture image and a still picture image.

2. Description of the Related Art

A solid state image-sensing device converts optical image into an electric signal, and is used for video camera or digital still camera. As to the image-sensing device, resolution of a picture depends on a number of pixels in the image-sensing device. Increasing a number of pixels can capture higher resolution images. Generally, a digital still camera uses an image-sensing device having more pixels than a conventional video camera to obtain higher resolution still picture images.

Recently, a video camera also adopts the function of digital still camera that obtains a still picture image in addition to a moving picture image. Accordingly, the image-sensing device for such a video camera requires more pixels than an image-sensing device for used in a conventional video camera which does not have the function of digital still camera. In addition, a number of pixels in an image-sensing device is increasing every year to obtain higher resolution pictures.

FIG. 1 is a partial enlarged view of a conventional solid state image-sensing device. In FIG. 1, an image-sensing device is composed of a plurality of photoelectric converters 31 which convert optical image into an electric signal, a plurality of vertical transferring CCDs (hereinafter referred to as VCCD) 32 which transfer an electric charge from the photoelectric converter 31 towards the vertical direction, a horizontal transferring CCD (hereinafter referred to as HCCD) 33 which shifts the electric charge from the VCCD 32 towards the horizontal direction, and an amplifier 34 to amplify the electric charge to be outputted from the HCCD 33.

A timing generator not shown provides a driving pulse signal in every one field period of television signal to the image-sensing device. The electric charge in the photoelectric converter 31 is transferred to every adjacent VCCD 32 by the timing of this driving pulse.

The VCCD 32 shifts the electric charge towards the HCCD 33 one by one stage of the VCCD 32, and the HCCD 33 outputs the electric charge through the amplifier 34 when the VCCD 32 transfers one stage of the electric charge to the HCCD 33. Accordingly, a shift velocity of electric charge in the HCCD 33 is set to a velocity which outputs all the electric charges through the amplifier 34 every time the electric charge is transferred from the VCCD 32.

In the VCCD 32 and HCCD 33, as a number of pixels increases horizontally and vertically, a number of stages to shift the electric charge also increases. Consequently, the clock frequency for transferring electric charge should also be increased and set faster as a number of pixels increases.

However, the increase of the clock frequency also increases power consumption, a heat problem and deterioration of signal-to-noise ratio. In view of the problem described above, there provided an image-sensing device shown in FIG. 2.

FIG. 2 is a plan view of an image-sensing device in accordance with the related art. In FIG. 2, the image-sensing device is composed of a pixel area 41 including a photoelectric converter and a VCCD, two HCCDs 42 and 43 for shifting an electric charge transferred from a VCCD in the pixel area 41, two adders 44 and 45 to add a reference signal on the electric charge to be outputted, and two amplifiers 46 and 47 to amplify the reference signal and the electric charge for predetermined level.

The electric charge transferred from the VCCD in the pixel area 41 is supplied to the HCCD 42 and the HCCD 43 respectively and then shifted towards the horizontal direction. Accordingly, the clock frequency necessary for shifting an electric charge in the HCCDs 42 and 43 can be set to half a frequency of using only one HCCD.

Generally, a pixel size of an image-sensing device becomes smaller as a number of pixels becomes bigger. The smaller pixel size deteriorates the transferring efficiency of an electric charge from VCCD to the HCCD 43 and resulted in affecting the quality of the picture.

Especially for a recent video camera, the size of camera itself is miniaturized including an optical mechanism that the size of the image-sensing device also becomes very small (such as ⅓ inch size or ¼ inch size, etc.). To have lots of photoelectric converters in a smaller image-sensing device may deteriorate the transferring efficiency of an electric charge which affects the picture quality.

SUMMARY OF THE INVENTION

Accordingly, in consideration of the above problem of the related art, the present invention provides an image-sensing device having over one million pixel which obtains good quality of pictures in full screen with suppressing the transferring clock frequency.

According to an aspect of the present invention, there provided an image-sensing device having a plurality of output channels including a pixel area having a plurality of first photoelectric converters (21a, 21b) to convert an optical image into an electric charge and a plurality of first vertical CCDs (22a, 22b) to transfer the electric charge vertically, an optical black area (15a, 15b, and 16) having a plurality of second photoelectric converters to produce an electric charge in optical black level and a plurality of second vertical CCDs to vertically transfer the electric charge disposed on both sides of the pixel area, a horizontal shift area (13a, 13b) having first and second horizontal CCDs to horizontally shift the electric charge transferred from the plurality of first and second vertical CCDs, an adder (17) for adding a reference signal to the plurality of first and second vertical CCDs, and an adjusting portion (4) for adjusting a level of electric charge outputted from the first and second horizontal CCDs, wherein the pixel area and the optical black area are divided into a first channel for transferring an electric charge to the first horizontal CCD (13a) and a second channel for transferring an electric charge to the second horizontal CCD (13b), respectively, and wherein the adjusting portion (4) adjusts a level of electric charge from each of the first and second channels based on the reference signal.

Other object and further features of the present invention will be apparent from the following detailed description when read in conjunction with the accompanying drawings.

BRIEF DESCRIPTION OF DRAWINGS

FIG. 5 is a plan view of an output stage of HCCD (horizontal transferring CCD) in the image-sensing device shown in FIG. 4.

FIG. 6(a) shows a waveform of CCD signal outputted from an amplifier 14a shown in FIGS. 4 and 5 for one scan line.

FIG. 6(b) shows a waveform of CCD signal outputted from an amplifier 14b for one scan line.

FIG. 6(c) shows one scan line of a vertical reference signal outputted from a vertical adder 17 and transferred through a vertical optical black (OB) portion 16, an pixel area 11a, an slide shift area 12a and a HCCD 13a shown in FIG. 4.

FIG. 6(d) shows one scan line of a vertical reference signal outputted from the vertical adder 17 and transferred through the vertical OB area 16, the pixel area 11b, the slide shift area 12b and an HCCD 13b.

FIG. 6(e) shows an example of CCD signal to be provided to a line converter 5 shown in FIG. 3.

DETAILED DESCRIPTION OF THE PREFERRED EMBODIMENTS

Figure 1:
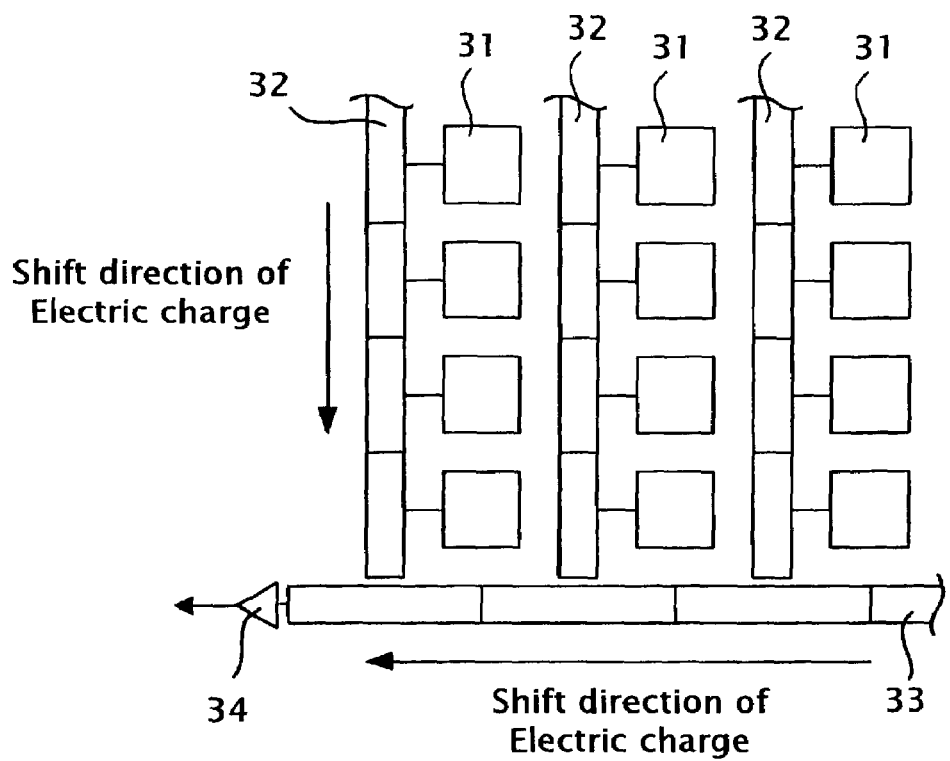
FIG. 1 is a partial enlarged view of a conventional solid state image-sensing device according to the related art.
Figure 2:
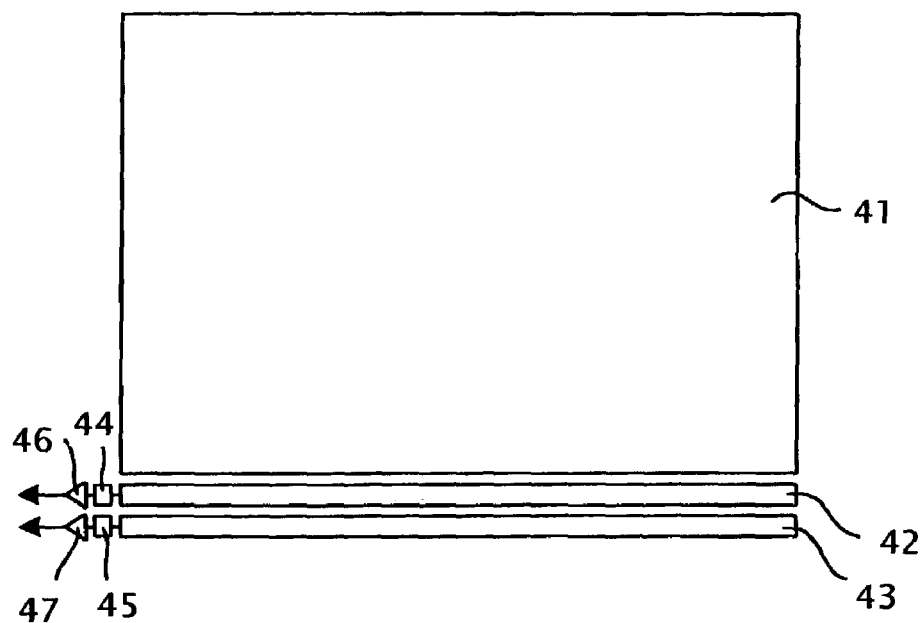
FIG. 2 is a plan view of another conventional solid state image-sensing device according to the related art.
Figure 3:
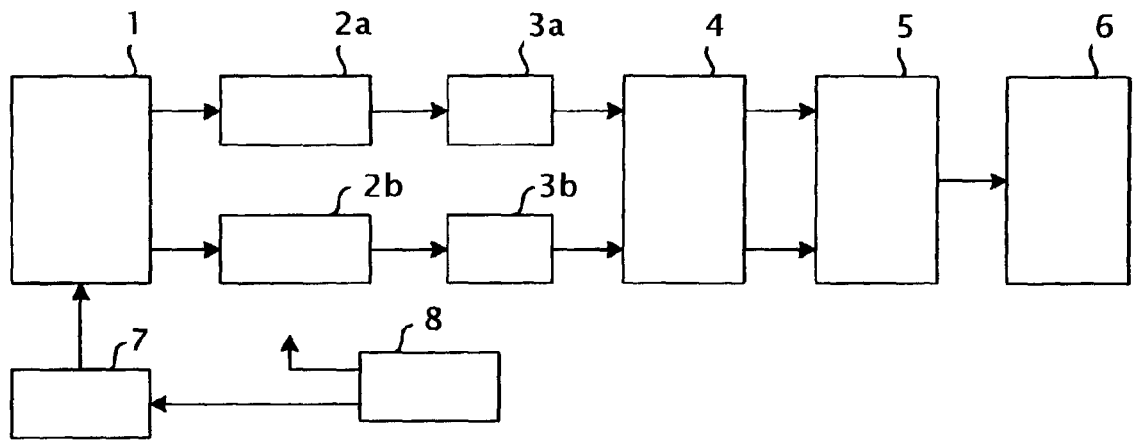
FIG. 3 is a block diagram of an imaging apparatus using an image-sensing device according to the present invention.

FIG. 3 is a block diagram of an imaging apparatus using an image-sensing device in accordance with the present invention. In FIG. 3, an imaging apparatus is composed of a solid state image-sensing device 1 to output an electric signal converted from an optical image, CDS/AG circuits 2a and 2b which clamp the signal outputted from each channel of the image-sensing device 1 and eliminate a noise element from the output signal and control the signal level thereof, A/D converters 3a and 3b which convert the output signal into a CCD signal in digital signal form, and an adjusting circuit 4 which adjusts the CCD signal level of each channel, a line converter 5 which converts a screen direction of the CCD signal, a Y/C processor 6 which carries out signal processing such as gamma correction and aperture control for the CCD signal, a timing generator 7 which provides a driving pulse for the image-sensing device 1, and a control circuit 8 which controls each element of the imaging apparatus.

Figure 4:
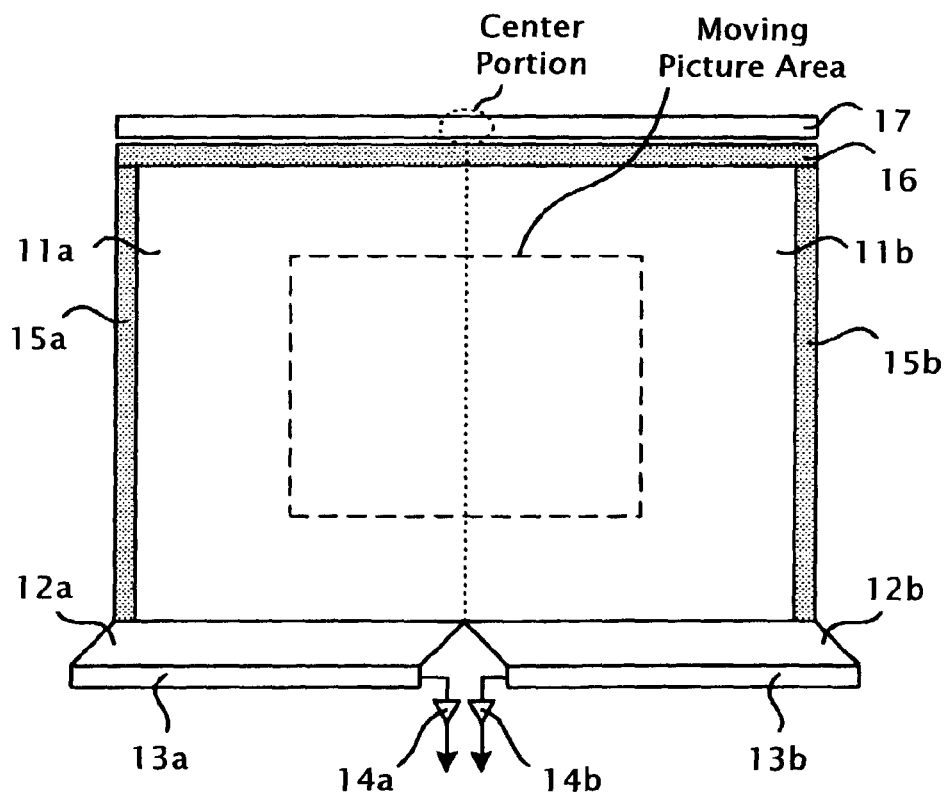
FIG. 4 is a plan view of the image-sensing device according to the present invention.

FIG. 4 is a plan view of the image-sensing device in accordance with the present invention. In FIG. 4, the image-sensing device 1 is composed of pixel areas 11a and 11b, slide shift areas 12a and 12b, HCCDs 13a and 13b, amplifiers 14a and 14b, horizontal optical black (OB) areas 15a and 15b, vertical optical black (OB) area 16, and vertical adder 17.

The pixel areas 11a and 11b have a plurality of photo-electric converters in horizontal and vertical array therein to convert an optical image into an electric charge, and have VCCDs to shift the electric charge towards the vertical direction and transfer the electric charge to the slide shift areas 12a and 12b. The slide shift areas 12a and 12b have a plurality of CCDs which shift the electric charge towards oblique direction. The HCCDs 13a and 13b shift the electric charge from the slide shift areas 12a and 12b towards the horizontal direction respectively. The amplifiers 14a and 14b amplify the electric charge outputted from the HCCDs 13a and 13b respectively.

The horizontal OB areas 15a and 15b output electric charge signals for the reference of optical black level to the vertical OB area 16. The vertical adder 17 adds an electric charge of predetermined level (also referred to as vertical reference signal) to the vertical OB area 16.

FIG. 5 is a plan view of an output stage of HCCD in the image-sensing device according to the present invention. In FIG. 5, an output stage of the image-sensing device is composed of a plurality of photoelectric converters 21a in the pixel area 11a shown in FIG. 4 which outputs the electric charge converted from the optical image, a plurality of VCCDs 22a which transfers the electric charge from the photoelectric converter 21a towards the vertical direction, a, plurality of slide shift CCDs 23a which shifts the electric charge transferred from the VCCD 22a towards the oblique direction to the HCCD 13a, a plurality of photoelectric converters 21b in the pixel area 11b shown in FIG. 4 which outputs the electric charge converted from the optical image, a plurality of VCCDs 22b which transfers the electric charge from the photoelectric converter 21b towards the vertical direction, a plurality of slide shift CCDs 23b which shifts the electric charge transferred from the VCCD 22b towards the oblique direction to the HCCD 13b, and the amplifiers 14a and 14b.

The photoelectric converter 21a and the VCCD 22a are included in the pixel areas 11a, and the slide shift CCD 23a is included in the slide shift area 12a shown in FIG. 4. The pixel area 11b shown in FIG. 4 has the plurality of photoelectric converters 21b, the plurality of VCCDs 22b, the plurality of slide shift CCDs 23b, which also obtain the electric charge and transfer the electric charge to the HCCD 13b.

The horizontal OB area 15a and 15b shown in FIG. 4 also include the photoelectric converters 21a and 21b and the VCCDs 22a and 22b respectively. However, the photoelectric converters 21a and 21b and the VCCDs 22a and 22b in the horizontal OB areas 15a and 15b are covered by mask shield. In order to obtain an optical black level signal, which provides the reference value of optical black level of the picture, the OB areas 15a and 15b are covered by mask shield to block the light from reaching the photoelectric converter 21 formed in the OB areas 15a and 15b.

Further, the vertical adder 17 outputs an electric charge to be added to a first electric charge shifted from the VCCD in the vertical optical black area 16.

The imaging apparatus according to the present invention obtains a still picture image in still picture image mode and a moving picture image in moving picture image mode, respectively. In the still picture image mode, all CCDs in the pixel areas 11a and 11b of the image-sensing device, shown in FIG. 4, is utilized to output CCD signal. In the moving picture image mode, a limited pixel area surrounded by the dotted line in FIG. 4 is utilized to output a CCD signal.

The horizontal and vertical OB information, and the vertical reference signal are outputted irrespective of the operation mode of either still picture image mode or moving picture image mode.

In the still picture image mode, the CCD signal is outputted from all CCDs in the pixel areas 11a and 11b for one time. In the moving picture image mode, the CCD signal is outputted from the CCD in the pixel area surrounded by the dotted line shown in FIG. 4 for once in every predetermined period.

The CCD signal outputted from the image-sensing device 1 is adjusted by the horizontal and vertical reference signals, and further by the horizontal and vertical OB information, irrespective of the still or moving picture image mode.

The control circuit 8 controls the timing generator 7 to provide the driving pulse to the image-sensing device 1. The driving pulse includes a read-out pulse of the photoelectric converters 21a and 21b, a vertical driving pulse for the VCCDs 22a and 22b, a driving pulse for the slide shift CCDs 23a and 23b, and a horizontal driving pulse for the HCCDs 13a and 13b.

At the time the timing generator 7 provides a read-out pulse to the image-sensing device 1, the electric charge accumulated in the photoelectric converters 21a and 21b in the area including the horizontal OB area 15a and 15b and the vertical OB area 16, are all transferred to adjacent VCCDs 22a and 22b at the same time. Then the electric charge is shifted to the HCCDs 13a and 13b by the timing of the vertical driving pulse from the timing generator 7, and subsequently, the electric charge transferred from the vertical adder 17 to the VCCDs 22a and 22b are also shifted to the HCCDs 13a and 13b.

The electric charge outputted from the VCCD 22a in the pixel area 11a and the horizontal OB area 15a shown in FIG. 4, is transferred to the slide shift CCD 23a in the slide shift area 12a. The electric charge outputted from the VCCD 22b in the pixel area 11b and the horizontal OB area 15b shown in FIG. 4, is transferred to the slide shift CCD 23b in the slide shift area 12b.

The driving pulse for the HCCDs 21a and 21b is also provided to the slide shift CCDs 23a and 23b that the electric charge is shifted to the oblique direction by the timing of the driving pulse. The electric charge shifted in the slide shift area 12a is transferred to the HCCD 13a and the electric charge shifted in the slide shift area 12b is transferred to the HCCD 13b, respectively.

The electric charge from the photoelectric converter 21a in the pixel area 11a and in the horizontal OB area 15a are transferred to the HCCD 13a through the VCCD 22a and the slide shift CCD 23a. The electric charges from the photoelectric converter 21b in the pixel area 11b and in the horizontal OB area 15b are transferred to the HCCD 13b through the VCCD 22b and the slide shift CCD 23b.

The electric charge from the photoelectric converter in the vertical OB area 16 and the electric charge from the vertical adder 17 are shifted to the slide shift CCDs 23a and 23b through the VCCDs 22a and 22b one by one stage. The electric charge in the center portion is transferred through the pixel areas 11a and 11b to the slide shift CCDs 23a and 23b. The electric charge in each side of the pixel areas 11a and 11b is transferred through the horizontal OB areas 15a and 15b to the slide shift CCDs 23a and 23b.

The electric charge is then transferred to the HCCD 13a and the HCCD 13b, and is shifted to the horizontal direction. The HCCDs 13a and 13b are provided with the horizontal driving pulse respectively. The two driving pulses have different phase that the electric charges in the HCCD 13a and the HCCD 13b are shifted towards opposite direction from each other.

Consequently, the electric charges in the HCCDs 13a and 13b are shifted to the arrow directions shown in FIG. 5, towards the amplifiers 14a and 14b. For example, FIG. 6(a) shows a waveform of CCD signal outputted from the amplifier 14a for one scan line. FIG. 6(b) shows a waveform of CCD signal outputted from the amplifier 14b for one scan line.

As the HCCD 13a and the HCCD 13b shifts the electric charge towards the direction opposite to each other, for example in this embodiment, the electric charge in the pixel area 11a is outputted from the pixels in right to left side, and the electric charge in the pixel area 11b is outputted from the pixels in left to right side.

Each electric charge in the pixel areas 11a and 11b is transferred to the different direction respectively. By dividing the whole pixel area into two pixel areas 11a and 11b, the electric charge in the divided two pixel areas 11a and 11b are outputted from divided border which is the center of the whole pixel area. In this sense, a number of transferring stages for shifting electric charge towards the horizontal direction in the pixel areas 11a and 11b becomes the same.

In other words, the photoelectric converters in the pixel areas 11a and 11b are in a line symmetric position with respect to the divided border that the number of transferring stages becomes the same in each pixel area. This prevents the difference of picture level in the pixel areas 11a and 11b which affects the quality of the picture.

FIG. 6(c) shows one scan line of a vertical reference signal outputted from the vertical adder 17 and transferred through the vertical OB area 16, the pixel area 11a, the slide shift area 12a, and the HCCD 13a. FIG. 6(d) shows one scan line of a vertical reference signal outputted from the vertical adder 17 and transferred through the vertical OB area 16, the pixel area 11b, the slide shift area 12b, and the HCCD 13b.

As described above, the electric charge in the pixel areas 11a and 11b, and the horizontal OB areas 15a and 15b shown in FIG. 4 are outputted from the bottom line through the top line of the pixel area that one screen of the picture information [for one screen] is outputted. On the other hand, this signal processing is conducted for every predetermined period in the moving picture image mode.

The image-sensing device 1 obtains two channels of CCD signals from the HCCDs 13a and 13b respectively. These two channel signals may include an error as explained below.

The error is caused by the difference of transferring efficiency of the electric charge in the center of the pixel area and in each side of the pixel areas.

As to the image-sensing device which can be used in the still picture image mode and the moving picture image mode, there is a large number of photoelectric converters and transferring CCDs in the pixel area that the transferring efficiency of the electric charge becomes different between the center portion and each side portion of the pixel area. This may cause the difference of the driving condition of the VCCD in the center portion and in both side portions of the pixel area.

Further, as to transfer of the electric charge in the slide shift CCDs 23a and 23b, the error between two channels of CCD signals may also be caused by a connecting angle of the VCCDs 22a and 22b and the HCCDs 13a and 13b. Further more, the transferring efficiency of the slide shift CCDs 23a and 23b are inferior to the VCCDs 22a and 22b in principle. This may also cause the error in the two channels of CCD signals.

The imaging apparatus in accordance with the present invention takes care of the error that it adjusts a CCD signal of each channel. For this reason, each channel of the CCD signal outputted from the image-sensing device 1 is provided to the CDS/AG circuits 2a and 2b respectively, and subsequently to the A/D converters 3a and 3b, and then to the adjusting circuit 4. The CDS/AGC circuits 2a and 2b clamp the CCD signal to eliminate a noise element and adjust the signal level thereof. Then the A/D converters 3a and 3b convert the CCD signal from the CDS/AGC circuits 2a and 2b into a digital signal form, and the adjusting circuit 4 adjusts the level of each channel of CCD signals.

The adjusting circuit 4 detects a smear element in the CCD signal outputted from the A/D converters 3a and 3b based on the vertical OB information.

Generally, when the smear is occurred in the CCD signal, relatively high level of electric charge is detected compared to the normal signal level. Accordingly, the vertical OB information in the CCD signal is compared with a predetermined threshold level to detect the smear in the CCD signal.

There are OB information in plural lines. The detection of the smear in CCD signal can be conducted accurately by utilizing plural OB information in the plural lines.

Upon the detection of the smear, there is at least a possibility of vertical reference signal in the CCD signal, wherein the smear is detected, is also affected by the smear. In other words, the level of the vertical reference signal may have been affected by the occurrence of the smear that the neighbor of the vertical reference signal can not be utilized as is.

For example, if the smear is detected in the pixel area 11a but not in the pixel area 11b, the vertical reference signal level of the CCD signal outputted from the pixel area 11a becomes bigger than that of the CCD signal outputted from the pixel area 11b.

For the reason above, the vertical reference signal in the horizontal OB areas 15a and 15b is utilized for level adjustment because it has little influence of the smear. The vertical reference signal from both sides of the pixel area is used for adjustment of the level of vertical reference signal outputted from the HCCDs 13a and 13b. This can absorb the variation of transferring efficiency of the slide shift CCDs 23a and 23b, and the HCCDs 13a and 13b.

If the smear is not detected, the vertical reference signal outputted from the center portion of the vertical adder 17 is utilized for making the same reference signal level as the CCD signal in each channel. This is because the transferring efficiency of the electric charge in the center portion of the pixel area visibly affects the picture image. Accordingly, the adjustment of the reference signal in the center portion of the vertical adder 17 absorbs the variation of the transferring efficiency in the VCCDs 22a and 22b, and the slide shift CCDs 23a and 23b contiguous to the center of the pixel area.

Even if the smear is detected, or not detected, the adjustment can be conducted more accurately by the clamp processing of the CDS/AGC circuits 2a and 2b utilizing the vertical OB information outputted from the same horizontal position of the vertical reference signal in each channel.

In this sense, the vertical OB information through the horizontal OB areas 15a and 15b is utilized for the clamp processing of the CDS/AGC circuits 2a and 2b when the smear is detected, and the vertical OB information through the center of the pixel area, i.e. the border of the pixel area 11a and 11b is utilized for the clamp processing of CDS/AGC circuit 2a and 2b when the smear is not detected.

In the case that the smear is not detected, the vertical reference signal from the center of the pixel area and from the horizontal OB areas 15a and 15b can be used for channel level adjustment. The vertical reference signal not only from the border of the pixel areas 15a and 15b but also from both sides of the pixel area, can be used for level adjustment. In addition, "shading", which is caused by deterioration of electric charge level upon shifting through plural stages can also be adjusted.

Further, not only the vertical reference signal outputted through the horizontal OB areas 15a and 15b but also all vertical reference signals can be utilized for level adjustment. Practically all reference signals can be used for the adjustment by calculating the average of all the reference signals, and adjusts the signal level of both channels of the CCD signal.

After the level of each channel of the CCD signal is adjusted in the adjusting circuit 4, the CCD signal is provided to the line converter 5. Then the CCD signal obtained from the pixel area 11a is reversed in the line direction.

FIG. 6(e) shows an example of CCD signal to be provided to the line converter 5. Each channel of the CCD signal is combined to form one CCD signal and is supplied to the Y/C processor 6. The Y/C processor conducts signal processing such as gamma correction and aperture control.

The embodiment of the present invention describes that the level adjustment of each channel of the CCD signal is conducted by utilizing the vertical reference signal provided by the vertical adder 17. However, for example, the vertical adder 17 for supplying horizontal electric charge to the top of line information can be provided between the HCCD 13a and the amplifier 14a and between the HCCD 13b and the amplifier 14b to adjust the level of each channel of the CCD signal.

As described above, the reference signal is provided to the first and second vertical CCDs, so that the signal level of each channel of the CCD signal can be adjusted suitably.

In the case that the image-sensing device has the slide shift CCD to transfer the electric charge in oblique direction, variation occurs in characteristic of each channel of the CCD signal. However, the imaging apparatus according to the present invention can also adjust such variation by the vertical reference signal to be added to each channel of the CCD signal.

In the case that the smear is not detected in the CCD signal, the CCD signal level of each channel is adjusted by the reference signal obtained from the border of the pixel area, so that the level of the CCD signal can be adjusted more accurately.

In the case that the smear is detected in the CCD signal, the reference signal in such a CCD signal is not utilized for level adjustment and the other channel of the CCD signal is used, so that the CCD signal can be adjusted more accurately irrespective of the detection of the smear.

It is to be understood that the invention is not limited in its application to the details of construction and arrangement of parts illustrated in the accompanying drawings, since the invention is capable of other embodiments and of being practiced or carried out in various ways. Also it is to be understood that the phraseology or terminology employed herein is for the purpose of description and not of limitation.

What is claimed is:

1. An image-sensing device having a plurality of output channels comprising:
   a pixel area having a plurality of photoelectric converters to convert an optical image into an electric charge and a plurality of first vertical CCDs to transfer the electric charge vertically;
   a horizontal optical black area having a plurality of photoelectric converters to produce an electric charge in an optical black level and a plurality of second vertical CCDs to vertically transfer the electric charge disposed on the left and right borders of the pixel area;
   a horizontal shift area having left and right horizontal CCDs to horizontally shift the electric charge transferred from the plurality of first vertical CCDs provided on both sides of a border dividing the whole pixel area into two pixel areas and the plurality of second vertical CCDs provided in the horizontal optical black area toward the border;
   a vertical adder for adding a reference signal to the plurality of first and second vertical CCDs provided at a top side of the image-sensing device confronting the horizontal shift area across the pixel area and the horizontal optical black area; and an adjusting portion for adjusting a level of electric charge outputted from the left and right horizontal CCDs, wherein the pixel area and the horizontal optical black area are divided into a left channel for transferring an electric charge to the left horizontal CCD and a right channel for transferring an electric charge to the right horizontal CCD, respectively, and wherein the adjusting portion adjusts a level of electric charge from the left and right channels by using the reference signal outputted from the plurality of second vertical CCDs in the horizontal optical black area when a smear is detected from outputs of the left and right channels.

2. The image-sensing device as claimed in claim 1, further comprising left and right slide shift areas for shifting the electric charge to an oblique direction, wherein the left slide shift area is composed of a plurality of left slide shift CCDs to shift the electric charge from the left channel to the left horizontal CCD, and wherein the right slide shift area is composed of a plurality of right slide shift CCDs to shift the electric charge from the right channel to the right horizontal CCD.

3. The image-sensing device as claimed in claim 1, wherein each output stage of the left and right horizontal CCDs is opposed to each other.

4. An image-sensing device having a plurality of output channels comprising:

a pixel area having a plurality of photoelectric converters to convert an optical image into an electric charge and a plurality of first vertical CCDs to transfer the electric charge vertically;

a horizontal optical black area having a plurality of photoelectric converters to produce an electric charge in an optical black level and a plurality of second vertical CCDs to vertically transfer the electric charge disposed on the left and right borders of the pixel area;

a horizontal shift area having left and right horizontal CCDs to horizontally shift the electric charge transferred from the plurality of first vertical CCDs provided on both sides of a border dividing the whole pixel area into two pixel areas and the plurality of second vertical CCDs provided in the horizontal optical black area toward the border;

a vertical adder for adding a reference signal to the plurality of first and second vertical CCDs provided at a top side of the image-sensing device confronting the horizontal shift area across the pixel area and the horizontal optical black area; and an adjusting portion for adjusting a level of electric charge outputted from the left and right horizontal CCDs, wherein the pixel area and the horizontal optical black area are divided into a left channel for transferring an electric charge to the left horizontal CCD and a right channel for transferring an electric charge to the right horizontal CCD, respectively, and wherein the adjusting portion adjusts a level of electric charge from each of the left and right channels by using at least the reference signal outputted from a center portion of the vertical adder when a smear is not detected from outputs of the left and right channels.

5. The image-sensing device as claimed in claim 4, further comprising left and right slide shift areas for shifting the electric charge to an oblique direction, wherein the left slide shift area is composed of a plurality of left slide shift CCDs to shift the electric charge from the left channel to the left horizontal CCD, and wherein the right slide shift area is composed of a plurality of right slide shift CCDs to shift the electric charge from the right channel to the right horizontal CCD.

6. The image-sensing device as claimed in claim 4, wherein each output stage of the left and right horizontal CCDs is opposed to each other.

7. A method of adjusting picture quality of an image-sensing device having a plurality of output channels comprising:

a pixel area having a plurality of photoelectric converters to convert an optical image into an electric charge and a plurality of first vertical CCDs to transfer the electric charge vertically;

a horizontal optical black area having a plurality of photoelectric converters to produce an electric charge in an optical black level and a plurality of second vertical CCDs to vertically transfer the electric charge disposed on the left and right borders of the pixel area;

a horizontal shift area having left and right horizontal CCDs to horizontally shift the electric charge transferred from the plurality of first vertical CCDs provided on both sides of a border dividing the whole pixel area into two pixel areas and the plurality of second vertical CCDs provided in the horizontal optical black area toward the border;

a vertical adder for adding a reference signal to the plurality of first and second vertical CCDs provided at a top side of the image-sensing device confronting the horizontal shift area across the pixel area and the horizontal optical black area; and an adjusting portion for adjusting a level of electric charge outputted from the left and right horizontal CCDs, wherein the pixel area and the horizontal optical black area are divided into a left channel for transferring an electric charge to the left horizontal CCD and a right channel for transferring an electric charge to the right horizontal CCD, respectively, the method comprising the steps of:

detecting whether or not a smear is generated in an electric charge outputted from the pixel area; and adjusting a level of the electric charge by using the reference signal outputted from the plurality of second vertical CCDs in the horizontal optical black area when a smear is detected.

8. A method of adjusting picture quality of an image-sensing device having a plurality of output channels comprising:

a pixel area having a plurality of photoelectric converters to convert an optical image into an electric charge and a plurality of first vertical CCDs to transfer the electric charge vertically;

a horizontal optical black area having a plurality of photoelectric converters to produce an electric charge in an optical black level and a plurality of second vertical CCDs to vertically transfer the electric charge disposed on the left and right borders of the pixel area;

a horizontal shift area having left and right horizontal CCDs to horizontally shift the electric charge transferred from the plurality of first vertical CCDs provided on both sides of a border dividing the whole pixel area into two pixel areas and the plurality of second vertical CCDs provided in the horizontal optical black area toward the border;

a vertical adder for adding a reference signal to the plurality of first and second vertical CCDs provided at a top side of the image-sensing device confronting the horizontal shift area across the pixel area and the horizontal optical black area; and an adjusting portion for adjusting a level of electric charge outputted from the left and right horizontal CCDs, wherein the pixel area and the horizontal optical black area are divided into a left channel for transferring an electric charge to the left horizontal CCD and a right channel for transferring an electric charge to the right horizontal CCD, respectively, the method comprising the steps of:

detecting whether or not a smear is generated in an electric charge outputted from the pixel area; and adjusting a level of the electric charge from the left and right channels by using the reference signal outputted from a center portion of the vertical ladder when a smear is not detected from outputs of the left and right channels.

* * * * *